(12) United States Patent
Brenner

(10) Patent No.: US 6,838,746 B2
(45) Date of Patent: Jan. 4, 2005

(54) SEMICONDUCTOR CONFIGURATION AND METHOD FOR FABRICATING THE CONFIGURATION

(75) Inventor: Pietro Brenner, Oberschleissheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/372,985

(22) Filed: Feb. 24, 2003

(65) Prior Publication Data

US 2003/0186548 A1 Oct. 2, 2003

Related U.S. Application Data

(63) Continuation of application No. PCT/DE01/02701, filed on Jul. 18, 2001.

(30) Foreign Application Priority Data

Aug. 24, 2000 (DE) .......................................... 100 41 691

(51) Int. Cl.[7] .............................................. H01L 29/00
(52) U.S. Cl. ........................ 257/510; 257/513; 257/506; 257/501
(58) Field of Search ................................ 257/531, 499, 257/500, 501, 506, 510, 516, 513, 758, 538, 659, 664, 533

(56) References Cited

U.S. PATENT DOCUMENTS

| | | | |
|---|---|---|---|
| 5,665,633 A | 9/1997 | Meyer | |
| 5,742,091 A | 4/1998 | Hébert | |
| 6,093,599 A | 7/2000 | Lee et al. | |
| 6,274,920 B1 * | 8/2001 | Park et al. | 257/531 |
| 6,337,254 B1 * | 1/2002 | Ahn | 438/424 |
| 6,512,283 B2 * | 1/2003 | Davies | 257/522 |

FOREIGN PATENT DOCUMENTS

| | | |
|---|---|---|
| DE | 38 25 547 A1 | 3/1989 |
| EP | 0 844 660 A1 | 5/1998 |
| EP | 0 966 040 A1 | 12/1999 |
| GB | 2 226 445 A | 6/1990 |
| WO | WO 97/45873 | 12/1997 |
| WO | WO 01/20649 A1 | 3/2001 |

OTHER PUBLICATIONS

Erzgräber, H. B. et al.: "A Novel Buried Oxide Isolation for Monolithic RF Inductors on Silicon", IEEE, 1998, pp. 535–539.

* cited by examiner

Primary Examiner—Tom Thomas
Assistant Examiner—Matthew Landau
(74) Attorney, Agent, or Firm—Laurence A. Greenberg; Werner H. Stemer; Ralph E. Locher

(57) ABSTRACT

The invention proposes a semiconductor configuration having a substrate, which has at least one component integrated therein. The substrate has a first main side with a metalization. At least parts of the metalization are underlaid with an insulation layer located in the substrate. By virtue of the fact that the insulation layer is realized in the form of a trench lattice, it is possible to reduce parasitic capacitances and undesirable signal power losses in the case of high-frequency signals.

5 Claims, 3 Drawing Sheets

SEMICONDUCTOR CONFIGURATION AND METHOD FOR FABRICATING THE CONFIGURATION

CROSS-REFERENCE TO RELATED APPLICATION

This application is a continuation of copending International Application No. PCT/DE01/02701, filed Jul. 18, 2001, which designated the United States and was not published in English.

BACKGROUND OF THE INVENTION

FIELD OF THE INVENTION

The invention relates to a semiconductor configuration having a substrate, which has at least one component integrated therein, in particular a transistor, having a trench surrounding the latter, and on whose first main side a metalization is provided, at least parts of the metalization being underlaid with an insulation layer located in the substrate.

When transmitting signals in the range above a few gigahertz via interconnects, large-area passive components, and when feeding in signals and coupling out signals at large-area terminal elements, the so-called contact-connecting pads, considerable losses in the signal power occur and the signal quality is impaired on account of parasitic capacitances. The parasitic capacitances are unavoidable on account of the capacitive coupling between the metal areas mentioned and the semiconductor substrate.

In order to be able to expediently realize a good, low-loss signal transmission even in the high gigahertz range, the signal losses must be kept as low as possible. This applies both to the operation of a semiconductor configuration, for example in the area of telecommunications, and in the metrological examination of the semiconductor configurations.

In order to measure and test the signal transmission properties, so-called s-parameter measurements are carried out. During this measurement, a high-frequency small signal with signal frequencies of up to 50 GHz is forwarded from the terminal elements via a metallic "on-wafer" feed line, with as few losses as possible and with the least distortion possible, to the semiconductor configuration to be measured. For feed-in purposes, a so-called RF test head is placed onto the terminal elements situated on the wafer, and then feeds in the signal and forwards the transmitted and reflected signal components in a 50 Ω system to the measuring unit. The feed lines from the terminal elements to the semiconductor configuration to be measured are typically 10 to a few 100 μm. The transmitted and reflected signal power are measured precisely depending on the signal frequency. At signal frequencies in the high gigahertz range, undesirable signal power losses occur particularly at the terminal elements on account of the capacitive signal coupling into the substrate of the semiconductor configuration.

In order to reduce the parasitic capacitances, inductances and series resistances, it is known to make the terminal elements and the leads (interconnects) as small as possible. However, narrow limits are imposed on this procedure on account of the available test heads of a measuring device. The minimization is likewise limited due to a minimum area for the terminal elements. Since the current densities continuously increase as the operating frequency increases in the case of an RF design of a semiconductor configuration, the leads or interconnects should be increased in size rather than decreased in size in order that the accompanying increase in the line inductances and the series resistances can be kept within tolerable limits.

The signal power losses can also be reduced by increasing the substrate resistance. However, increasing the resistivity of the substrate also provides a considerable increase in the latch-up susceptibility and the substrate coupling between different circuit blocks. Consequently, process engineering considerations mean that narrow limits are imposed on increasing the substrate resistivity.

In order to reduce the losses in integrated coils, the article "Novel Buried Oxide Isolation for Monolithic RF Inductors on Silicon" by H. B. Erzgräber, T. Grabolla, H. H. Richter, P. Schley and A. Wolff, IEDM 98, pages 535 to 530, discloses providing an insulation layer in the substrate below the integrated coil. In this case, a trench isolation technique with very large trench depths is used, in the case of which the remaining parallel silicon webs are completely oxidized. The method described in the article serves for improving the quality factor of the integrated coil, in which case the relevant losses are to be sought in the eddy currents in the deeper substrate. On account of this, comparatively deep trenches are necessary, which makes the fabrication more complicated. The "hard" oxidation step carried out in that case destroys bipolar and CMOS transistors situated in the substrate, with the result that the method proposed in that case can only be used to a limited extent.

SUMMARY OF THE INVENTION

It is accordingly an object of the invention to provide a semiconductor configuration and a method for fabricating the semiconductor configuration, which overcome the above-mentioned disadvantages of the prior art apparatus and methods of this general type.

In particular, it is an object of the invention to provide a semiconductor configuration in which an improvement in the signal transmission is achieved through a reduction of the signal losses. Furthermore, the intention is to specify a method for fabricating such a semiconductor configuration.

With the foregoing and other objects in view there is provided, in accordance with the invention, a semiconductor configuration including a substrate having at least one component integrated therein. The substrate has a first main side with a metallization. The substrate has an insulation layer underlying at least parts of the metallization. The insulation layer includes a trench lattice having a plurality of pillars and a plurality of insulator-filled trenches located between the plurality of pillars. The plurality of pillars is oxidized semiconductor material.

In accordance with an added feature of the invention, the insulator in the plurality of trenches of the trench lattice is PSG.

In accordance with an additional feature of the invention, an epitaxial layer is located between the insulation layer and the metallization. The epitaxial layer forms a pn junction with the substrate.

In accordance with another feature of the invention, the substrate is a wafer; the metalization has terminal elements for contact connecting measuring heads; and the insulation layer underlies the terminal elements.

In accordance with a further feature of the invention, the metalization has a plurality of polysilicon resistors; and the insulation layer underlies the plurality of polysilicon resistors.

In accordance with a further added feature of the invention, a plurality of regions are implanted in the substrate below the insulation layer; and the plurality of regions serve as a channel stopper.

With the foregoing and other objects in view there is also provided, in accordance with the invention, a method for fabricating a semiconductor configuration, which includes steps of: providing a substrate made of silicon and having at least one component integrated therein; providing a metalization on a first main side of the substrate; underlying at least parts of the metalization with an insulation layer including a trench lattice fabricated in the substrate by: constructing a plurality of trenches at the first main side of the substrate such that pillars made of silicon remain between the plurality of trenches, and filling the plurality of trenches with an insulator; and oxidizing the pillars.

In accordance with an added mode of the invention, the step of filling the plurality of trenches with the insulator includes using PSG as the insulator.

The invention provides for the insulation layer to be realized in the form of a trench lattice. The trench lattice and a trench surrounding the integrated component can be fabricated in the same method step.

The invention is based on the insight that the capacitive loss currents into the substrate are directly proportional to the area of the metalization and directly proportional to the signal frequency, but indirectly proportional to the distance between the substrate and the metalization carrying the signal. The dominant loss effect during the signal transmission is the coupling of a radiofrequency signal into the semiconductor substrate. The area-specific capacitive conductivity per unit area A of the metalization is given by:

$$y_A = 2\pi f \epsilon_0 \epsilon_r / d,$$

where f is the signal frequency, $\epsilon_0$ is the electric field constant, $\epsilon_r$ is the relative permittivity of the insulation material between the metalization and the substrate, and d is the spatial distance between the metalization and the substrate. This specific conductivity can be significantly reduced by using materials with the lowest possible $\epsilon_r$. These materials are known by the name "low-k dielectrics".

A reduction of the specific conductivity is furthermore possible, in accordance with the above formula, by increasing the distance d between the metalization and the substrate.

The invention proposes a very simple and efficient possibility for producing this distance by means of a process technique that is available in many modern semiconductor technologies, and thereby considerably reducing the parasitic capacitances.

By virtue of the fact that an insulation layer in the form of a trench lattice is provided in the substrate, the distance d can be increased by the factor 2 to 3, depending on the available trench depth. A low-impedance field implantation can be omitted, as required, in the region of the trench lattice. The pillars remaining in the trench lattice include the semiconductor substrate and have high impedance. The higher the impedance of the substrate situated below the metalization, the lower the losses produced therein due to eddy currents and the substrate-skin effect.

The fabrication of the trench lattice is extremely simple since the fabrication methods are known from the prior art. No additional process step is necessary, moreover, since trenches are produced around all the transistors in a substrate. In other words, this means that the trench lattice and a trench surrounding the integrated component are fabricated by the same method step. All that is necessary is to use a modified mask.

The trenches can be produced by a dry etching process, a subsequent wet-chemical cleaning and by subsequently filling the trenches with an insulator, e.g. PSG glass. A complete oxidation of the remaining substrate pillars can, but need not, additionally be effected. The configuration of the lattice can be produced through the choice of a suitable mask.

Consequently, the invention permits incompletely oxidized semiconductor residual pillars or residual webs which are minimized by the rhomboidal or rectangular pattern of the trenches of the trench lattice. As a result of this, an optimized semiconductor component which can be fabricated in a cost-effective manner can be produced without additional masks or additional process steps.

The insulation layer advantageously extends to the first main side of the substrate. The trench lattice is advantageously formed in rectangular or rhomboidal fashion. If the dimensions of the cells of the trench lattice are configured such that, during the possible—but not essential—oxidation step following the trench etching, the substrate material is oxidized as far as the etching depth of the trench, then a silicon oxide is produced which is highly insulating and has a low relative permittivity of $\epsilon_r = 3.3$. In order to achieve an oxidation that is as complete as possible, it is particularly advantageous to embody the cells of the lattice in a rectangular or rhomboidal form.

In principle, the entire main side could be provided with the trench lattice—with the exception of the components of the semiconductor configuration. It suffices, however, merely for those locations of the metalization which are sensitive with regard to a high-frequency signal to be underlaid with the trench lattice. The metalization usually has externally contact-connectable terminal elements (contact pads), polysilicon resistors, interconnects and, depending on the application, integrated coils as well. According to the invention, at least some of the terminal elements, the integrated coils, the interconnects, or the integrated polysilicon resistors are underlaid with the insulation layer.

Large-area components are particularly critical, such as e.g. the externally contact-connectable terminal elements or integrated coils. Only those terminal elements that are situated in the signal path of the radiofrequency signals have to be underlaid with the insulation layer.

In one refinement, the terminal elements, the integrated coils, at least signal-critical parts of the interconnects, or the integrated polysilicon resistors may in each case be underlaid with an assigned region of the insulation layer. In this case, it is advantageous if the regions of the insulation layer project laterally beyond a respective terminal element, a respective integrated coil, the chosen part of the interconnect, or a respective integrated polysilicon resistor. The signal losses can be reduced as a result of this.

The semiconductor configuration may be either a semiconductor test structure, a semiconductor chip, or a wafer, on which terminal elements for the contact connection of measuring heads are provided thereon. In the case of terminal elements which are provided for contact connection with a measuring head, it is necessary to reduce the parasitic capacitances for a correct measurement, in order to obtain a measurement that is as accurate as possible.

The capacitive coupling to the substrate is always an RC element, and the signal power can only be lost in the resistance R of the substrate. Consequently, there are two ways of minimizing the loss: $R \Rightarrow 0$ or $R \Rightarrow \infty$.

An appropriate substrate is, in particular, silicon, since the latter has very low impedance in most modern production technologies and the substrate losses can be correspondingly high. When a gallium arsenide substrate is used, the undesirable signal losses do not occur to the same extent as with a substrate made of silicon, since gallium arsenide wafers have significantly higher impedance.

In principle, the invention can be used with any desired wafer material. However, the benefit depends greatly on the wafer material on which production is effected. The resistivity of the wafer material may be between 0.01 Ωcm and up to 10 MΩcm.

Other features which are considered as characteristic for the invention are set forth in the appended claims.

Although the invention is illustrated and described herein as embodied in a semiconductor configuration and method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
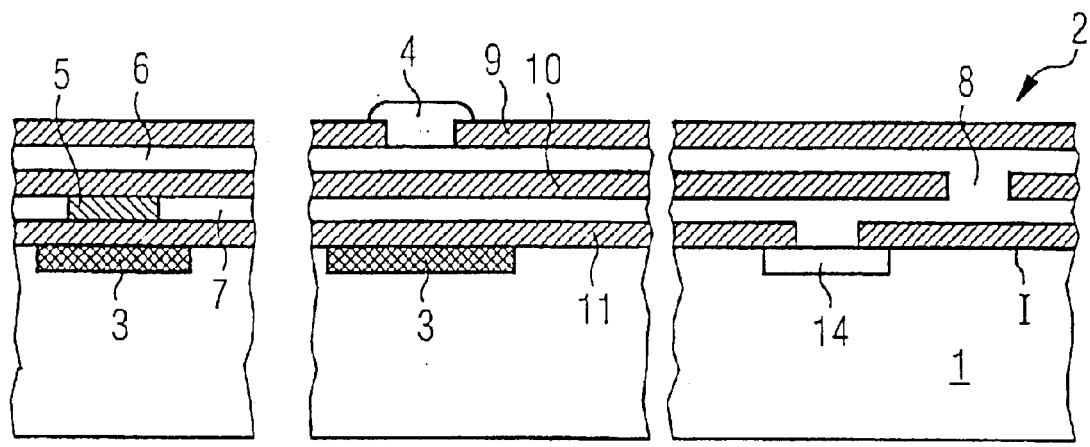
FIG. 1 is a cross sectional view of a portion of an inventive semiconductor configuration.

Referring now to the figures of the drawing in detail and first, particularly, to FIG. 1 thereof, there is shown a cross section of a portion of an inventive semiconductor configuration. On a substrate 1, which preferably includes silicon, a metalization 2 is applied on a first main side I. In the substrate 1 there is provided at least one component in the form of wells located in the substrate. The diode formed from the well 14 and the substrate 1 is representative of a component of this type. It goes without saying that the inventive semiconductor configuration can include a multiplicity of components which can be connected to one another as desired.

The metalization 2 includes two metalization planes in the present exemplary embodiment. Each metalization plane has interconnects 6, 7, which are isolated from one another by an oxide layer 10. A further oxide layer 11 is applied between the first metalization plane with the interconnects 7 and the first main side I of the substrate 1. In order to protect the topmost metalization plane (interconnects 6), an oxide layer 9 or a passivation is likewise applied. The latter has, in a known manner, cutouts through which an externally contact-connectable terminal element 4 can be connected to one of the interconnects 6. The interconnects of the lower and of the upper metalization plane can, but need not, be connected to one another by plated-through holes 8. By way of example, the lower metalization plane has a polysilicon resistor 5. Polysilicon resistors often require larger areas and thus lead to a non-negligible capacitance with respect to the substrate. When high-frequency currents are impressed through such polysilicon resistors, the latter become frequency-dependent since the polysilicon resistors then behave primarily like an RC element. This capacitance with respect to the substrate can be significantly reduced by the insulation layer 3 below the polysilicon resistor 5.

It goes without saying that the invention is not restricted to an exemplary embodiment with only two metalization planes, but rather can be employed for any desired number of metalization planes.

Figure 5:
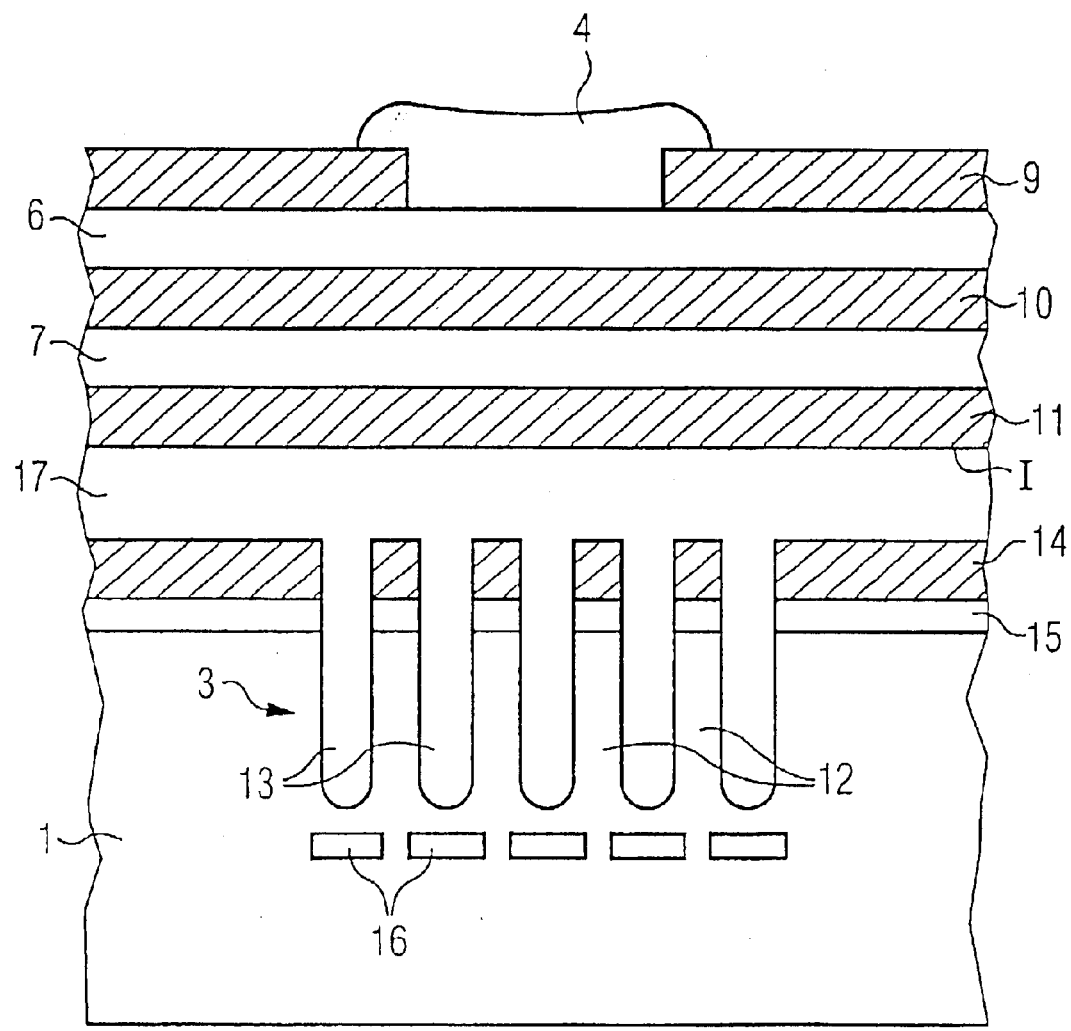
FIG. 5 is a cross sectional view through the inventive semiconductor configuration with a concrete configuration of the trench lattice.

It shall be assumed that a high-frequency signal in the region of a few gigahertz is fed in at the terminal element 4. In order to reduce a parasitic capacitance between the metalization of the terminal element 4 and the substrate 1, according to the invention an insulation layer 3 is provided below the terminal element 4. The insulation layer 3 is designed in the form of a trench lattice and extends to the first main side I of the substrate 1. It can readily be seen from the sectional illustration of FIG. 1 that the insulation layer 3 extends laterally beyond the lateral boundaries of the terminal element 4, in order to enable a best possible reduction of the parasitic capacitances which would result in a power loss. One possible concrete configuration of the trench lattice is shown in FIG. 5.

Since polysilicon resistors also have a significant capacitive coupling to the substrate, an insulation layer 3 is likewise provided below the polysilicon resistor 5. The insulation layer 3 likewise projects laterally beyond the polysilicon resistor 5.

Figure 2:
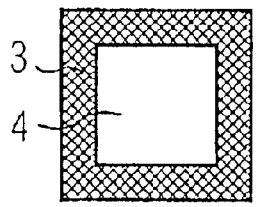
FIG. 2 is a plan view showing the ratio of a terminal element and an underlying insulation layer.

The lateral projection of the insulation layer 3 beyond those parts of the metalization that are to be protected can likewise readily be seen from FIG. 2, which illustrates a plan view of the terminal element 4 and the laterally projecting insulation layer 3.

Furthermore, it can readily be seen from FIG. 1 that the insulation layer 3—with the exception of the components, need not cover the entire main side I of the substrate. It suffices merely for those parts of the metalization to be underlaid with an insulation layer which carry high-frequency signals or at which high-frequency signals are coupled in or out.

Figure 3:
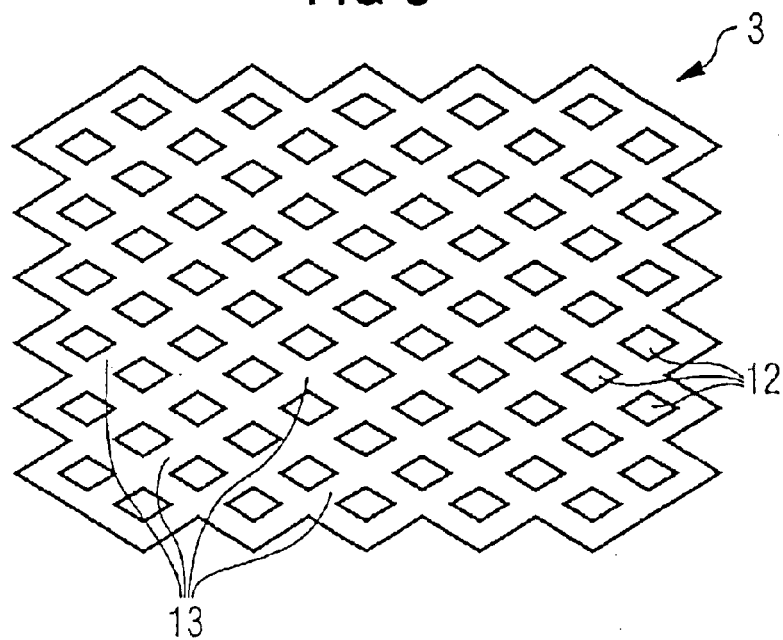
FIG. 3 is a view of an exemplary embodiment of a trench lattice.

FIG. 3 illustrates an exemplary configuration of the trench lattice used in the invention. The trenches that are etched into the substrate are designated by 13. The substrate pillars remaining after the etching step are accordingly designated by 12. The etched trenches are filled with an insulator, preferably PSG glass.

In this case, the individual cells of the trench lattice preferably lie next to one another in such a way that, during an optional subsequent oxidation step, the remaining substrate material (pillars 12) is minimized or, if possible in terms of the process technology, disappears entirely in order to obtain a continuous insulation layer.

If the substrate includes silicon, then silicon oxide is produced after the optional oxidation step. Since silicon oxide is highly insulating and has a relatively small relative permittivity, the specific capacitive conductivity can be reduced by the factor 2 to 3 merely on account of this layout measure.

A further advantage of the invention consists in an achievable reduction of the interfering coupling of RF interference signals into the semiconductor substrate. Through consistent use of the trench lattices in all RF-critical signal paths, the signal crosstalk, which is extremely critical in the complex mixed-signal chip design, can likewise be considerably reduced.

Figure 4:
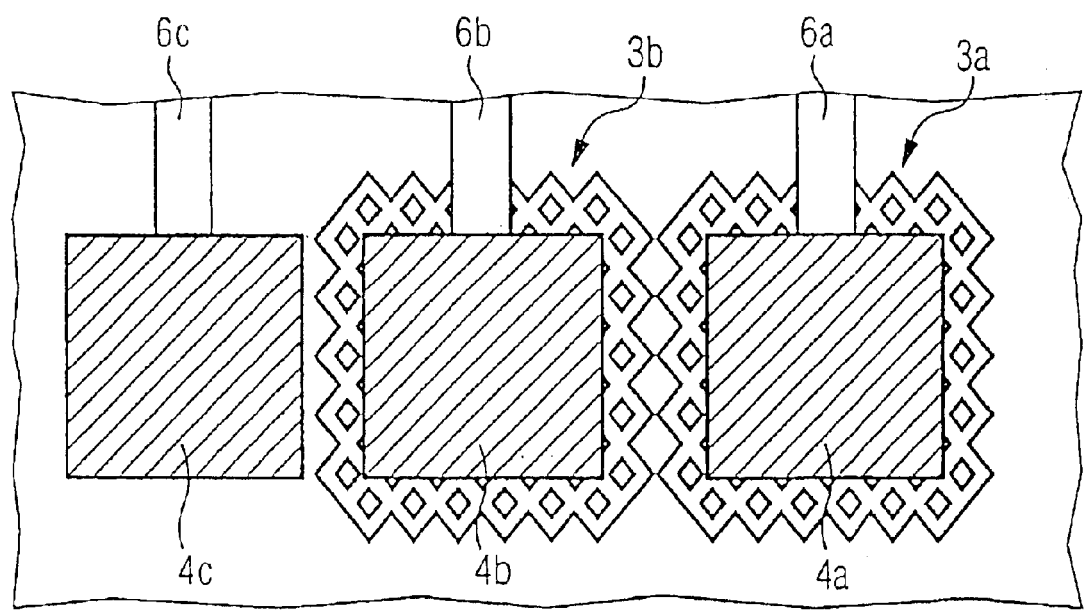
FIG. 4 is a plan view of a semiconductor configuration with a plurality of terminal elements.

FIG. 4 is a plan view of a portion of the inventive semiconductor configuration. Three terminal elements 4a, 4b, 4c with respective interconnects 6a, 6b, 6c are illustrated by way of example. The supply voltage, for example, is applied to the terminal element 4c. A high-frequency signal is applied to the other two terminal elements 4a, 4b. Only the two terminal elements 4a, 4b are underlaid with a respective trench lattice 3a, 3b. It would also be conceivable to provide just a single trench lattice below the terminal elements 4a, 4b. Since there is no high-frequency signal present at the terminal element 4c, the trench lattice is not necessary there. In principle, any critical signal line path that only contains components in the metalization planes can be underlaid with trench lattices. In particular, those interconnects that carry radiofrequency signals are critical.

FIG. 5 shows a cross sectional view through the inventive semiconductor configuration with one possible concrete exemplary configuration of the trench lattice. The trench lattice is located below the terminal element and projects laterally beyond the latter. In the present exemplary embodiment, an epitaxial layer 15 is applied to the substrate 1. An insulator 14 is applied, e.g. thermally or by CVD (Chemical Vapor Deposition) deposition, on the epitaxial layer 15. A further insulator 17, which extends to the first main side I, is concomitantly applied during the filling of the trenches 13. The insulator 17 and also the trenches 13 preferably include PSG glass. It can readily be seen from FIG. 5 that substrate pillars 12 remain between the trenches 13. These remaining semiconductor pillars have the same doping profile as the substrate 1 in the vertical direction. The remaining pillar thus has the basic doping of the wafer. The epitaxial layer 15 depicted in FIG. 5 is optional. Between the epitaxial layer 15 and the substrate 1 there is formed a traditional PN junction with a relatively wide space charge zone, since a lightly doped PN junction is preferably involved. The PN space charge zone behaves like an insulation layer and produces a further serial capacitance with respect to the substrate 1.

Furthermore, regions 16 which represent a so-called "channel stopper" are depicted in the substrate 1 in FIG. 5. These, for example, implanted regions 16 are not absolutely necessary, but are advantageous. In order to achieve the desired effect, it suffices for the trenches 13 to extend approximately 5 nm into the substrate 1. At as little a depth as this, a good signal quality is achieved when high-frequency signals are fed in at the terminal element 4. It goes without saying that the trench depth could also be significantly greater. The trench depth essentially depends on the semiconductor material used and on the frequency of the signal fed in at the terminal element.

By utilizing the trench technique that is available in semiconductor processes, it is possible to reduce the parasitic capacitance between metalization structures and substrate by the factor 2 to 3. The trench technique has hitherto been developed in order to significantly improve the electrical isolation between components in a substrate and in order to drastically reduce the chip area required per component and is currently in widespread use for these purposes. The invention opens up a further possibility for using the known trench technique and thereby offers a simple and cost-effective possibility of significantly improving the radiofrequency signal transmission in radiofrequency arrangements on semiconductor substrates.

The invention can likewise be used when testing RF components, by those terminal elements which are contact-connected by a measuring head being underlaid with the trench lattice. If the leads, that is to say the interconnects to the component to be tested are additionally underlaid with the insulation layer the interfering capacitive coupling can be significantly reduced.

What is claimed is:

1. A semiconductor configuration, comprising:
   a substrate having at least one component integrated therein;
   said substrate having a first main side with a metalization;
   said substrate having an insulation layer underlying at least parts of said metalization;
   said substrate having an epitaxial layer located between said insulation layer and said metalization;
   said epitaxial layer forming a pn junction with said substrate;
   said insulation layer including a trench lattice having a plurality of pillars and a plurality of insulator-filled trenches located between said plurality of pillars; and
   said plurality of pillars being oxidized semiconductor material.

2. The semiconductor configuration according to claim 1, wherein said insulator in said plurality of trenches of said trench lattice is PSG.

3. The semiconductor configuration according to claim 1, wherein:
   said substrate is a wafer;
   said metalization has terminal elements for contact connecting measuring heads; and
   said insulation layer underlies said terminal elements.

4. The semiconductor configuration according to claim 1, wherein:
   said metalization has a plurality of polysilicon resistors; and
   said insulation layer underlies said plurality of polysilicon resistors.

5. The semiconductor configuration according to claim 1, comprising;
   a plurality of regions implanted in said substrate below said insulation layer;
   said plurality of regions serving as a channel stopper.

* * * * *